US010546905B2

(12) United States Patent
Liu et al.

(10) Patent No.: US 10,546,905 B2
(45) Date of Patent: Jan. 28, 2020

(54) METHOD FOR MANUFACTURING ARRAY SUBSTRATE AND METHOD FOR MANUFACTURING DISPLAY DEVICE

(71) Applicant: BOE TECHNOLOGY GROUP CO., LTD., Beijing (CN)

(72) Inventors: Wenqu Liu, Beijing (CN); Liwen Dong, Beijing (CN); Feng Zhang, Beijing (CN); Zhijun Lv, Beijing (CN); Ning Dang, Beijing (CN); Shizheng Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/023,400

(22) Filed: Jun. 29, 2018

(65) Prior Publication Data
US 2019/0027545 A1  Jan. 24, 2019

(30) Foreign Application Priority Data

Jul. 20, 2017  (CN) .......................... 2017 1 0595959

(51) Int. Cl.
*H01L 27/32* (2006.01)
*H01L 51/00* (2006.01)
(Continued)

(52) U.S. Cl.
CPC ...... *H01L 27/3262* (2013.01); *H01L 27/3244* (2013.01); *H01L 27/3248* (2013.01);
(Continued)

(58) Field of Classification Search
CPC ............. H01L 27/3244; H01L 27/3248; H01L 27/3266; H01L 27/3281; H01L 51/0097;
(Continued)

(56) References Cited

U.S. PATENT DOCUMENTS 6,456,358 B1   9/2002  Lu
8,773,631 B2 *  7/2014  Kim ..................... G02F 1/13394
                                      349/110
(Continued)

FOREIGN PATENT DOCUMENTS

CN         102593379 A    7/2012
CN         104752612 A    7/2015
(Continued)

OTHER PUBLICATIONS

Office Action dated May 4, 2018 issued in corresponding Chinese Application No. 201710595959.8.

*Primary Examiner* — Stephen W Smoot
(74) *Attorney, Agent, or Firm* — Nath, Goldberg & Meyer; Joshua B. Goldberg

(57) ABSTRACT

The present invention provides a method for manufacturing an array substrate, including; a step of providing a substrate; a step of making an electrode layer on the substrate; and a step of making a spacer layer and a spacer column on the electrode layer; wherein the spacer column is made by heat-treatment while the spacer layer is being formed, and a method for manufacturing an array substrate. The method for manufacturing an array substrate provided by the present invention can not only shorten the production cycle, lower the production cost, but also avoid the threshold voltage drift of the TFT due to the irradiation of a large area of ultraviolet rays.

12 Claims, 4 Drawing Sheets

(51) Int. Cl.
  *H01L 51/52*     (2006.01)
  *H01L 51/56*     (2006.01)
(52) U.S. Cl.
  CPC ........ *H01L 51/0097* (2013.01); *H01L 51/525* (2013.01); *H01L 51/5237* (2013.01); *H01L 51/56* (2013.01); *H01L 2227/323* (2013.01); *H01L 2251/5338* (2013.01)
(58) Field of Classification Search
  CPC ... H01L 51/5237; H01L 51/525; H01L 51/56; H01L 2227/323; H01L 2251/5338; H01L 2251/56
  See application file for complete search history.

(56) References Cited

U.S. PATENT DOCUMENTS

| | | | |
|---|---|---|---|
| 9,329,421 B2* | 5/2016 | Lee | G02B 5/201 |
| 9,893,140 B2 | 2/2018 | He et al. | |
| 2015/0185551 A1* | 7/2015 | Kim | G02F 1/133514 |
| | | | 349/110 |
| 2016/0365395 A1* | 12/2016 | Xu | H01L 51/5246 |
| 2017/0010496 A1* | 1/2017 | Shim | G02F 1/13394 |
| 2019/0035864 A1* | 1/2019 | Liu | G02F 1/13394 |

FOREIGN PATENT DOCUMENTS

| | | |
|---|---|---|
| CN | 104766933 A | 7/2015 |
| JP | 2002-56987 A | 2/2002 |

* cited by examiner

METHOD FOR MANUFACTURING ARRAY SUBSTRATE AND METHOD FOR MANUFACTURING DISPLAY DEVICE

CROSS-REFERENCE TO RELATED APPLICATION

This application claims the priority of Chinese Patent Application No. 201710595959.8 submitted on Jul. 20, 2017, the disclosure of which is incorporated herein in its entirety by reference.

TECHNICAL FIELD

The present disclosure relates to the field of display technology, particularly to a method for manufacturing an array substrate, as well as a method for manufacturing a display device.

BACKGROUND

The organic light-emitting diode (OLED) display products are widely used in mobile phones, digital video cameras, DVD players, personal digital assistants (PDAs), laptops, car audios, televisions and the like. At present, OLED products are mainly prepared through 9 mask steps.

In the OLED products, flexible OLED structures have been widely used. The method for manufacturing a flexible OLED structure involves the manufacture of an array substrate. However, the above manufacture of the array substrate involves at least lithography process of 9 masks, for example, the lithography process including respectively forming an active layer, two gate electrodes, a connection layer, a source electrode and a drain electrode, a planarization layer, an electrode layer, an spacer layer, and an spacer column.

SUMMARY

Therefore, the existing manufacturing method of the flexible OLED has a long production cycle, thereby resulting in an increase in production costs. Moreover, in making the spacer layer and the spacer column, due to a need to perform two photolithography processes, the energy of the double exposure is too large, thereby resulting in a threshold voltage shift (Vth shift) of the TFT due to the irradiation of a large area of ultraviolet rays.

Therefore, in order to solve at least one of the above-mentioned technical problems, the present invention provides a method for manufacturing an array substrate, including:

a step of providing a substrate;

a step of making an electrode layer on the substrate; and a step of making a spacer layer and a spacer column on the electrode layer;

wherein the spacer column is formed by heat-treatment while the spacer layer is being formed.

Optionally, the step of making a spacer layer and a spacer column on the electrode layer includes:

step S1 that uses an organic material to form a film of the spacer layer;

step S2 that patterns the film of the spacer layer to form a desired pattern of the spacer layer and a spacer portion; and step S3, performing a heat-treatment to the spacer portion to increase the thickness of the spacer portion, thereby forming the spacer column and the spacer layer.

Optionally, in the step S2, a groove is formed at a position where the spacer portion is located when forming the desired pattern of the spacer layer, and the spacer portion is independently formed in the groove.

Optionally, in the step S2, the length of the spacer portion is 4-15 μm, preferably 10 μm, and the width of the spacer portion is 4-15 μm.

Optionally, in the step S3, a temperature of the heat-treatment is 230° C. to 250° C.

Optionally, a duration time for the heat-treatment is 60 min to 90 min.

Optionally, a thickness of the spacer column is increased by 1 μm or more.

Optionally, the method for manufacturing an array substrate further includes forming a guiding film layer, a transition layer, an active layer, a gate electrode, a connection layer, a source/drain electrode, and a planarization layer sequentially on the substrate before making the electrode layer on the substrate.

Optionally, the gate electrode includes a first gate insulating layer, a first gate electrode, a second gate insulating layer and a second gate electrode formed sequentially, and the first gate electrode and the second gate electrode correspond to different pixels, respectively.

In another example, the present invention also provides a method for manufacturing a display device, including manufacture of an array substrate, wherein the manufacture of the array substrate includes the following steps:

a step of providing a substrate;

a step of making an electrode layer on the substrate; and a step of making a spacer layer and a spacer column on the electrode layer;

wherein the spacer column is formed by a heat-treatment while the spacer layer is being formed.

Optionally, the display device is a flexible OLED.

Optionally, the method for manufacturing a display device further includes an evaporating step and an encapsulating step of the OLED.

Optionally, the array substrate includes a substrate and a guiding film layer, a transition layer, an active layer, two gate electrodes, a connection layer, a source/drain electrode, a planarization layer and a spacer layer and a spacer column sequentially formed on the substrate.

The present invention has the following beneficial effects:

According to the method for manufacturing an array substrate provided by the present invention, a spacer is manufactured simultaneously with a spacer layer. In this method, when the film of the spacer layer is patterned, an isolation portion is formed, and then the spacer portion is subjected to heat treatment to increase the thickness thereof, thereby forming a spacer column. As a result, the lithography process can be reduced by one time, so that the production cycle can be shortened, the production cost can be reduced, and the threshold voltage drift of the TFT due to irradiation of a large area of ultraviolet rays can be avoided.

Therefore, by adopting the above method for manufacturing the array substrate provided by the present invention, the method for manufacturing a display device provided by the present invention can not only shorten the production cycle, lower the production cost, but also avoid the threshold voltage drift of the TFT due to the irradiation of a large area of ultraviolet rays.

DETAILED DESCRIPTION

In order to enable those skilled in the art to better understand the technical solutions of the present invention, the method for manufacturing the array substrate and the method for manufacturing the display device provided by the present invention will be described in detail below in conjunction with the accompanying drawings.

As mentioned above, the method for manufacturing the array substrate includes: a step of providing a substrate; a step of making an electrode layer on the substrate; and a step of making a spacer layer and a spacer column on the electrode layer; wherein the spacer column is formed by heat-treatment while the spacer layer is being formed.

Figure 1:
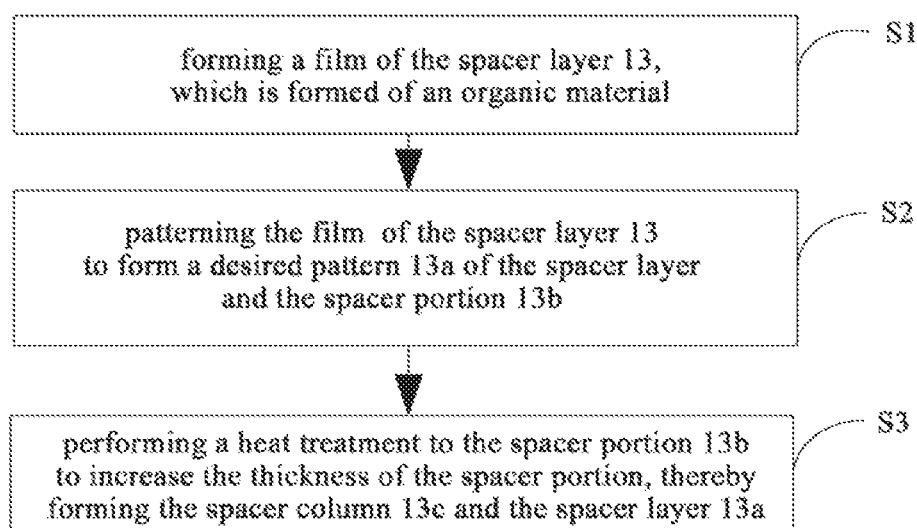
FIG. 1 is a flow chart showing a method for manufacturing an array substrate provided by some examples of the present invention.
Figure 2A:
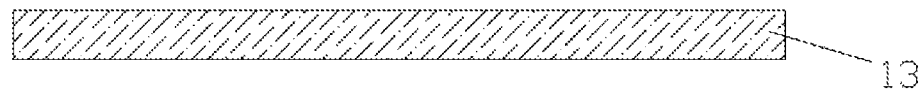
FIG. 2A is a process diagram showing the step S1 in some examples of the present invention.

Specifically, please referring to FIG. 1, it is a flow chart of the steps of manufacturing a spacer layer and a spacer column provided by some examples of the present invention. As shown in FIG. 1, the step of making a spacer layer and a spacer column includes:

S1, forming a film 13 of the spacer layer which is formed of an organic material. Optionally, as shown in FIG. 2A, entire of the film layer 13 of the spacer layer is deposited using an organic material.

S2, patterning the film 13 of the spacer layer to form the desired pattern 13a of the spacer layer and the spacer portion 13b. Optionally, as shown in FIG. 2B, entire of the film layer 13 of the spacer layer is patterned to form the desired pattern 13a of the spacer layer, and the spacer portion 13b is formed at the position where the spacer column is located.

Figure 2B:
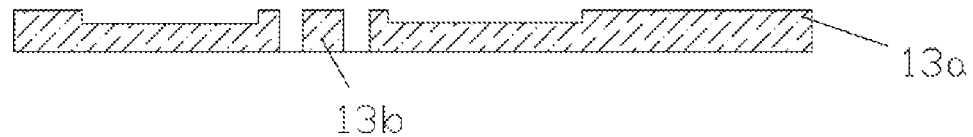
FIG. 2B is a process diagram showing step S2 in some examples of the present invention.
Figure 2C:
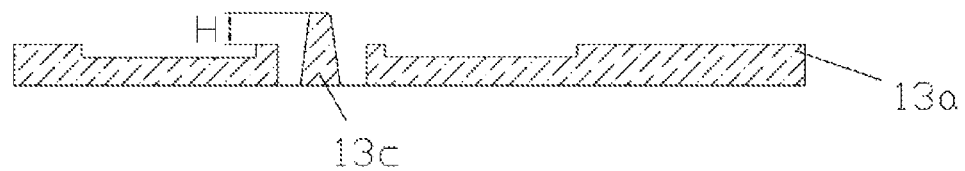
FIG. 2C is a process diagram showing step S3 in some examples of the present invention.

S3, performing heat-treatment to the spacer portion 13b to increase its thickness, thereby forming the spacer column 13c and the spacer layer 13a, as shown in FIG. 2C. Optionally, the thickness of the spacer column 13c is increased by H=1 μm or more so as to function as a spacer column.

In the above step S2, the above spacer portion 13b is an organic material, wherein the organic material undergoes a "turtle island effect" under heat-treatment conditions, that is, the above spacer portion 13b independently forms a "turtle island" structure with respect to the desired pattern 13a of the spacer layer, and the edge portion of the "turtle island" structure will shrink toward the middle under high temperature, thereby causing the thickness of the spacer portion 13b to gradually increase to form the spacer column 13c. The spacer column 13c is higher than the thickness of the desired pattern 13a of the spacer layer, so that it can function as a spacer column, that is, it plays a supporting role in the encapsulation. The thickness of the spacer portion 13b is related to the thickness of the spacer column 13c, and the greater the thickness of the spacer portion 13b, the greater the thickness of the spacer column 13c. By using the above method to simultaneously make the spacer column and the spacer layer, the lithography process can be reduced by one time, so that the production cycle can be shortened, the production cost can be reduced, and the threshold voltage drift of the TFT due to irradiation of a large area of ultraviolet rays can be avoided.

In addition, in order to make the spacer portion 13b form a "turtle island" structure independent of the desired pattern 13a of the spacer layer, in the above step S2, a groove is formed at the position of the spacer portion 13b when forming the desired pattern 13a of the spacer layer, and the spacer portion 13b is independently formed in the groove, as shown in FIG. 2B.

In order to make the thickness of the spacer column 13c meet the process requirements, in the step S2, the length of the spacer portion 13b is 4-15 μm, preferably 10 μm, and the width of the spacer portion 13b is 4-15 μm, generally 5 μm, In the above step S3, the temperature of the heat-treatment is 230° C. to 250° C. Preferably, the duration time for the heat-treatment is 60 min to 90 min.

Referring to FIGS. 3A-3H, they show the method for manufacturing the array substrate provided according to some examples of the present invention, and based on the above examples, such method provides some examples of the method for manufacturing the array substrate of flexible OLE©.

Specifically, the method for manufacturing an array substrate further includes forming a guiding film layer 2, a transition layer 3, an active layer 4, a gate electrode, a connection layer 9, a source/drain electrode 10, and a planarization layer 11 sequentially on the substrate 1 before making the electrode layer 12.

In these examples, the above gate electrode includes a first gate insulating layer 5, a first gate electrode 6, a second gate insulating layer 7 and a second gate electrode 8 formed sequentially, and the first gate electrode 6 and the second gate electrode 8 correspond to different pixels, respectively.

Figure 3A:
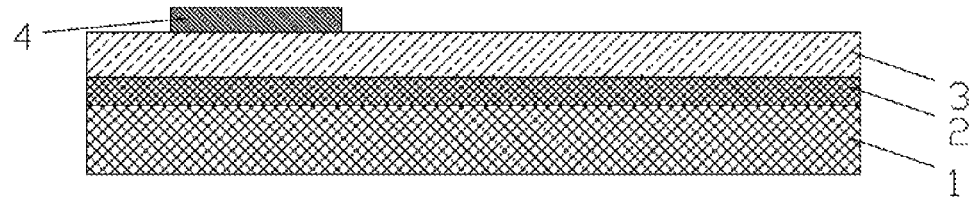
FIG. 3A is a manufacturing process diagram showing the active layer in some examples of the present invention.

Please referring to FIG. 3A to FIG. 3H, the process of manufacturing each of the above film layers will be described in detail below. Specifically, as shown in FIG. 3A, a guiding film layer 2, a transition layer 3, and an active layer 4 are formed sequentially on the substrate 1. Wherein, the guiding film layer 2 may be two layers with a total thickness of 20 μm. In the process of making the active layer 4, first, an amorphous silicon material is formed on the transition layer 3, and an amorphous silicon material is subjected to an excimer laser annealing process (ELA process) to be converted into a polysilicon material; then, the polysilicon material is subjected to a lithography process, a dry etching process, a peeling process, and an ion implantation process capable of improving the threshold voltage, thereby finally forming the active layer 4.

Figure 3B:
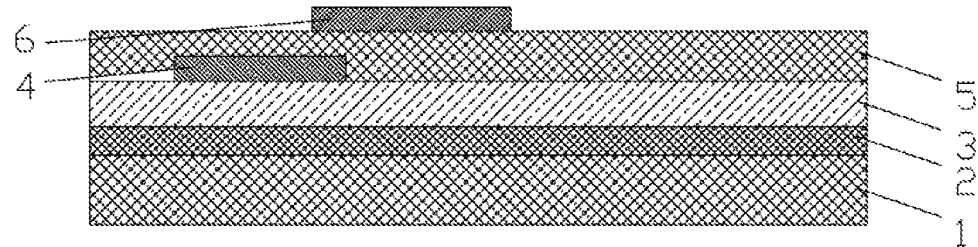
FIG. 3B is a manufacturing process diagram showing the first gate electrode in some examples of the present invention.

As shown in FIG. 3B, a first gate insulating layer 5 and a first gate electrode 6 are sequentially formed, and the film thicknesses of the first gate insulating layer 5 and the first gate electrode 6 are 1200 A and 2700 A, respectively. Then, the first gate electrode 6 is subjected to a lithography process, a dry etching process, a peeling process, and an ion implantation process capable of improving the threshold voltage, thereby finally forming the first gate electrode 6.

Figure 3C:
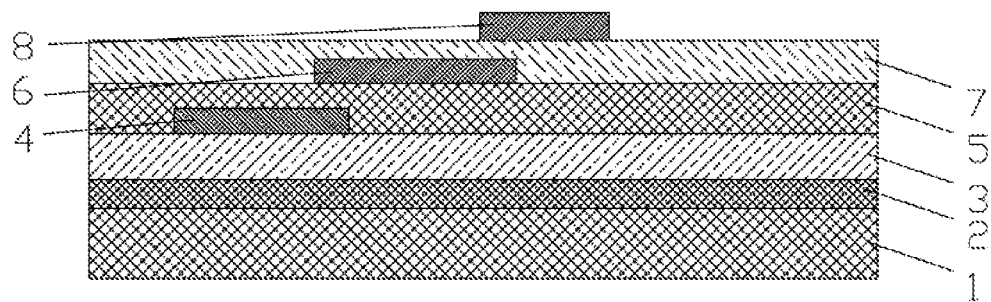
FIG. 3C is a manufacturing process diagram showing the second gate electrode in some examples of the present invention.

As shown in FIG. 3C, a second gate insulating layer 7 and a second gate electrode 8 are sequentially formed, and the film thickness of the second gate insulating layer 7 and the second gate electrode 8 are 1300A and 2700A, respectively. Then, the second gate electrode 8 is subjected to a lithography process, a dry etching process and a peeling process, thereby finally forming the second gate electrode 8.

Figure 3D:
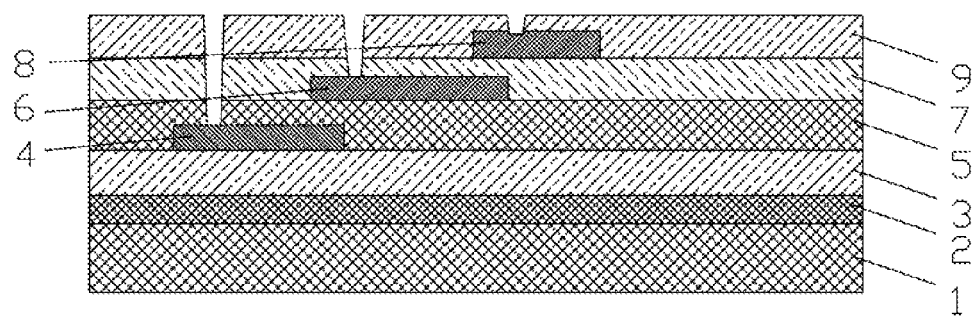
FIG. 3D is a manufacturing process diagram showing the connection layer in some examples of the present invention.

As shown in FIG. 3D, a connection layer 9 is formed. Wherein, first, the thin film of the connection layer 9 is formed to have a film thickness of 5000A; then, the thin film of the connection layer 9 is subjected to a high-temperature annealing process, a lithography process, a dry etching process, a peeling process and a hydrogenation treatment to finally form the connection layer 9.

Figure 3E:
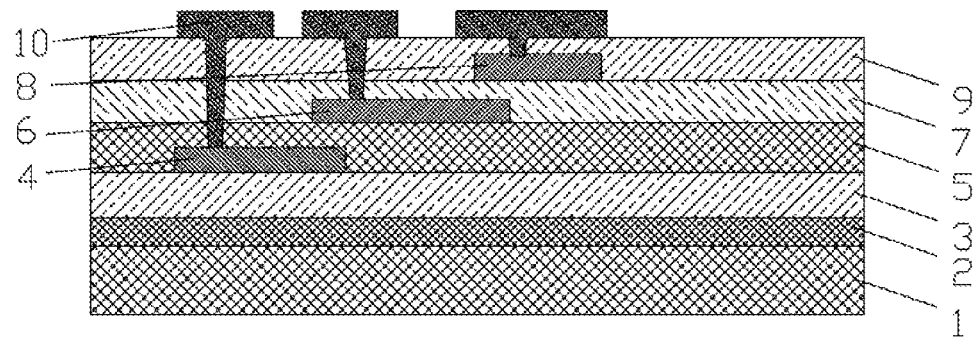
FIG. 3E is a manufacturing process diagram showing the source electrode and the drain electrode in some examples of the present invention.

As shown in FIG. 3E, source electrodes and drain electrodes 10 are formed. First, a buffer oxide etching solution is used to perform a cleaning process (BOE cleaning), and then a first Ti metal layer, an Al metal layer, and a second Ti metal layer are sequentially formed, and the film thicknesses of the first Ti metal layer, the Al metal layer, and the second Ti metal layer are 500A, 6500A, and 500A, respectively. After that, a lithography process, a dry etching process, a peeling process and an annealing process are performed to finally form the source electrodes and drain electrodes 10.

Figure 3F:
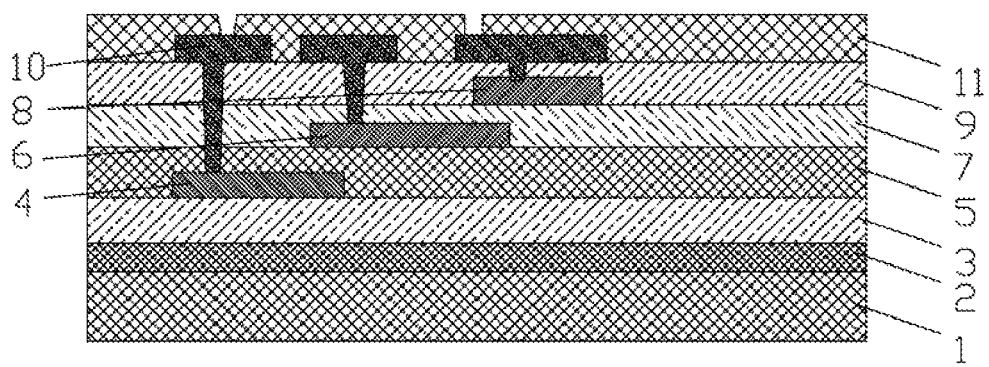
FIG. 3F is a manufacturing process diagram showing the planarization layer in some examples of the present invention.

As shown in FIG. 3F, a planarization layer 11 is formed. First, a film of the planarization layer 11 is formed, and then the planarization layer 11 is subjected to a lithography process and a high temperature process to finally form the flat layer 11.

Figure 3G:
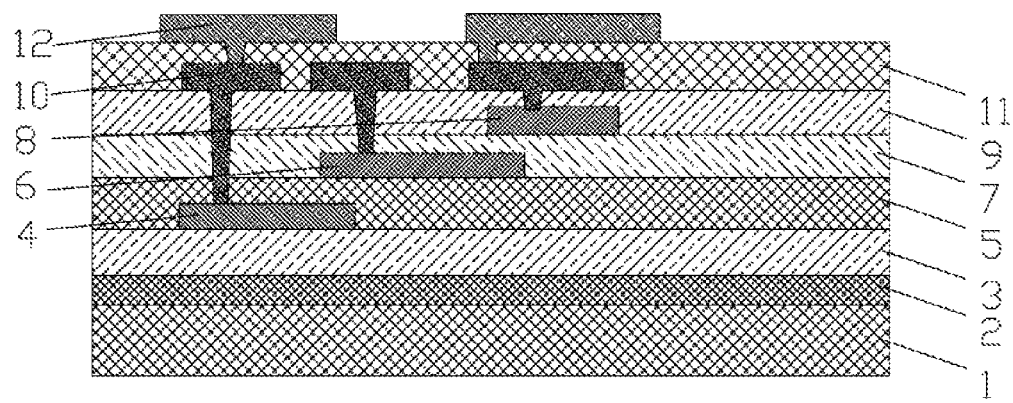
FIG. 3G is a manufacturing process diagram showing the electrode layer in some examples of the present invention.

As shown in FIG. 3G, an electrode layer 12 is formed. First, a first ITO metal layer, an Ag metal layer, and a second ITO metal layer are sequentially formed, and the film thickness of the first ITO metal layer, the Ag metal layer, and the second ITO metal layer are 80A, 1000A and 80A, respectively. After that, a lithography process, a wet etching process and a peeling process are performed to finally form the electrode layer 12. The electrode layer 12 can be used as a common electrode or a pixel electrode according to different needs.

Figure 3H:
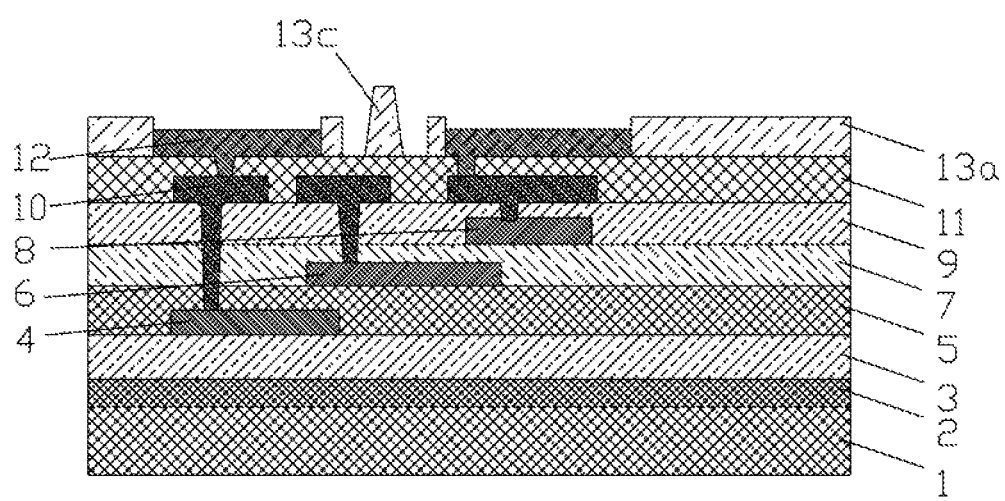
FIG. 3H is a manufacturing process diagram showing the spacer layer and the spacer column in some examples of the present invention.

As shown in FIG. 3H, the spacer column 13*c* is formed by heat-treatment while the spacer layer 13*a* is being formed. The method has been described in detail in the above examples, and will not be described again here.

It should be noted that, in practical applications, the array substrate is not limited to the above structure adopted in the present examples, and the film layer of the array substrate may be increased or decreased according to specific needs.

In some other examples, the present invention also provides a method for manufacturing a display device, which includes the manufacture of the array substrate provided by the above various examples of the present invention.

The above display device may be a flexible OLED. Therefore, the method for manufacturing a display device may further include an evaporating step and an encapsulating step of the OLED.

By adopting the above method for manufacturing the array substrate provided by the above various examples of the present invention, the method for manufacturing a display device provided by the present invention can not only shorten the production cycle, lower the production cost, but also avoid the threshold voltage drift of the TFT due to the irradiation of a large area of ultraviolet rays.

It can be understood that the above embodiments are merely exemplary s employed for illustrating the principle of the present invention, but the present invention is not limited thereto. For a person skilled in the art, various variations and modifications may be formed without departing from the spirit and essence of the present invention, and these variations and modifications are also considered to be within the protection scope of the present invention.

The invention claimed is:

1. A method for manufacturing an array substrate, including:
   a step of providing a substrate;
   a step of making an electrode layer on the substrate; and
   a step of making a spacer layer and a spacer column on the electrode layer;
   wherein the spacer column is made by heat-treatment while the spacer layer is being made and wherein the step of making a spacer layer and a spacer column on the electrode layer includes:
   step S1 that uses an organic material to form a film of the spacer layer;
   step S2 that patterns the film of the spacer layer to form the desired pattern of the spacer layer and a spacer portion; and
   step S3 that preforms heat-treatment to the spacer portion to increase the thickness of the spacer portion, thereby forming the spacer column and the spacer layer.

2. The method for manufacturing an array substrate according to claim 1, wherein, in the step S2, a groove is formed at a position where the spacer portion is located when forming the desired pattern of the spacer layer, and the spacer portion is independently formed in the groove.

3. The method for manufacturing an array substrate according to claim 1, wherein, in the step S2, the length of the spacer portion is 4-15 μm, and the width of the spacer portion is 4-15 μm.

4. The method for manufacturing an array substrate according to claim 3, wherein the length of the spacer portion is 10 and the width of the spacer portion is 5 μm.

5. The method for manufacturing an array substrate according to claim 1, wherein the heat-treatment is performed at a temperature of 230° C. to 250° C.

6. The method for manufacturing an array substrate according to claim 5, wherein a duration time for the heat-treatment is 60 min to 90 min.

7. The method for manufacturing an array substrate according to claim 1, wherein the thickness of the spacer column is increased by 1 μm or more.

8. The method for manufacturing an array substrate according to claim 1, further including forming a guiding film layer, a transition layer, an active layer, a gate electrode, a connection layer, a source/drain electrode, and a planarization layer sequentially on the substrate before making the electrode layer on the substrate.

9. The method for manufacturing an array substrate according to claim 8, wherein the gate electrode includes a first gate insulating layer, a first gate electrode, a second gate insulating layer and a second gate electrode formed sequentially, and the first gate electrode and the second gate electrode correspond to different pixels, respectively.

10. A method for manufacturing a display device, including manufacture of an array substrate, wherein the manufacture of the array substrate includes the following steps:
   a step of providing a substrate;
   a step of making an electrode layer on the substrate; and
   a step of making a spacer layer and a spacer column on the electrode layer;

wherein the spacer column is made by heat-treatment while the spacer layer is being made, and wherein the step of making a spacer layer and a spacer column on the electrode layer includes:

step S1 that uses an organic material to form a film of the spacer layer;

step S2 that patterns the film of the spacer layer to form the desired pattern of the spacer layer and a spacer portion; and step S3 that performs heat-treatment to the spacer portion to increase the thickness of the spacer portion, thereby forming the spacer column and the spacer layer.

11. The method for manufacturing a display device according to claim 10, wherein the display device is a flexible OLED.

12. The method for manufacturing a display device according to claim 11, further including an evaporating step and an encapsulating step of the OLED.

* * * * *